June 13, 1967 E. FRÖSCHLE 3,325,700

NEUTRALIZING MEANS FOR SEMICONDUCTOR DEVICES

Filed Oct. 25, 1961 3 Sheets-Sheet 1

Ernst Fröschle

Inventor:

By: George H. Spencer

Attorney

Ernst Fröschle

Inventor:

By: George H. Spencer

Attorney

June 13, 1967 E. FRÖSCHLE 3,325,700

NEUTRALIZING MEANS FOR SEMICONDUCTOR DEVICES

Filed Oct. 25, 1961 3 Sheets-Sheet 3

INVENTOR
Ernst Fröschle
BY Spencer & Kaye
ATTORNEYS

United States Patent Office 3,325,700

Patented June 13, 1967

3,325,700

NEUTRALIZING MEANS FOR SEMICONDUCTOR DEVICES

Ernst Fröschle, Ulm (Danube), Germany, assignor to Telefunken Aktiengesellschaft, Berlin-Charlottenburg, Germany Filed Oct. 25, 1961, Ser. No. 147,610
Claims priority, application Germany, Nov. 2, 1960, T 19,216
15 Claims. (Cl. 317—234)

The present invention relates generally to semiconductor devices, and more particularly to transistors for use in high frequency and high power applications.

It is known that most semiconductor devices require neutralization which means a compensation of the undesired capacitance between input and output of the device. Most semiconductor devices need in operation also an adjustment which means a compensation of the output capacitance. This is especially true of transistors for high power and high frequency operation. The maximum power that can be delivered by transistors is very closely related to the size of the electrodes. In the case of transistors having fairly small electrodes and which are used at frequencies which are not too high, the output capacitances and feedback capacitances may be neutralized relatively easily by using exterior inductances. However, in the case of transistors operating at high power and high frequencies, neutralization or adjustment on the output side, i.e., tuning away the output capacitance, presents considerable difficulties.

With these defects of the prior art in mind, it is a main object of the present invention to provide semiconductor devices, especially transistors, with leads for connecting neutralizing or adjusting elements to the transistors, or to arrange these elements directly at the semiconductor electrodes.

Another object of the invention is to provide a device of the character described, which obviates short circuits caused by the neutralizing or adjusting elements.

These objects and others ancillary thereto are accomplished according to preferred embodiments of the invention, wherein separate electrode lead wires are provided for adjustment or neutralization. "Separate electrode lead wires" is understood to mean that the neutralizing or adjusting elements are no longer arranged at the end of the electrode lead wires generally serving for power supply or power output as has been conventional heretofore. According to the invention, the electrode lead wire for input capacitances and output capacitances is no longer used for the neutralizing or adjusting elements; but, rather the neutralizing or adjusting elements either receive their own lead wires, or are arranged directly at the semiconductor electrodes. If the separate lead wires for the adjusting or neutralizing elements are not directly soldered to the semiconductor electrodes, they are connected with the electrode lead wires serving for the power supply or the power output in the immediate vicinity of the electrodes of the semiconductor and at least within its housing.

The present invention is based on the insight that the lead inductances common to the neutralizing elements and the input and output circuits very markedly increase the feedback, especially in the case of high frequencies, and in many cases cause undesirable oscillations of the transistor. When operating at frequencies which are not too high, it is generally advantageous to lead the separate electrode lead wires out of the housing and to connect the neutralizing and adjusting elements outside the housing to these separate electrode lead wires.

With operation at very high frequencies or high outputs, the inductances required for neutralization or adjustment assume such small values that neutralization or adjustment is possible only if the neutralizing on adjusting elements are connected directly with the semiconductor electrodes within the housing.

The neutralizing or adjusting elements are designed in such a way that a D.C. type short circuit is avoided. It is advisable to use variable inductance elements. A metal bow is a suitable neutralizing or adjusting element. It may be connected directly with the electrodes in question, if no individual lead wires are provided. The metal bow may easily be constructed so that by deforming the bow, greatly varied inductances may be obtained. However, the metal bow may not connect the corresponding electrodes directly with one another. In order to avoid a D.C. type short circuit, at least one end of the metal bow must be separated from one electrode by an insulating layer. Preferably, this insulating layer is so thin that the capacitance between the neutralizing or adjusting element and the electrode separated therefrom by the insulating layer, is greater than the inner capacitance to be neutralized.

As already pointed out, a variation of the inductance values may be easily achieved if the metal bow is mechanically deformable.

The insulating layer may be eliminated and a D.C. type short circuit may be avoided by capacitively coupling the metal bow to the one semiconductor electrode with the aid of a p-n junction.

Additional objects and advantages of the present invention will become apparent upon consideration of the following description when taken in conjunction with the accompanying drawings in which.

Figure 1:
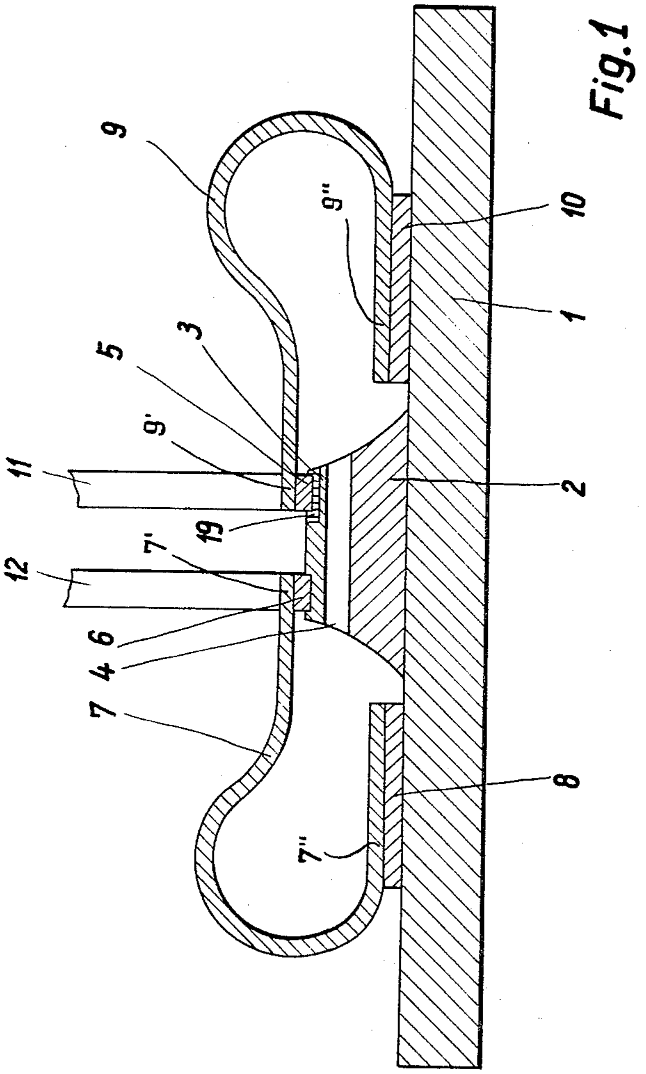
FIGURE 1 is a sectional view through a mesa transistor illustrating one embodiment of the present invention.

With more particular reference to the drawings, FIGURE 1 illustrates a semiconductor body of mesa shape, mounted on a base plate 1 on the collector side thereof. The semiconductor body comprises the collector zone 2, the base zone 3, an intervening intrinsic zone 4, and the emitter zone 19. The emitter electrode 5 and the base electrode 6 are alloyed into the semiconductor body. One end 7' of a bow-shaped lead wire 7 is soldered onto the base electrode 6 to neutralize the base-collector capacitance. The other end 7'' of this lead wire is not placed directly onto the base plate 1 but is separated from it by an insulating layer 8 in order to avoid a DC type short circuit. If desired the lead wires may be seated in individual socket connections.

The bow-shaped lead wire 9 is used to neutralize at least the major part of the emitter-collector capacitance and serves as adjusting element. As seen in FIGURE 1, the lead wire 9, in a manner completely analogous to that of the lead wire 7, is connected at one end 9' with the emitter-electrode 5, and at the other end 9'' with the collector electrode 1, an insulating layer 10 being interposed therebetween. The inductance of the bow-shaped lead wires 7 and 9 may be easily adjusted as required by simple deformation. In the embodiment of FIGURE 1, the electrode lead wires 11 and 12 for the emitter electrode and the base electrode are soldered onto the bow-shaped lead wires 7 and 9.

Figure 2:
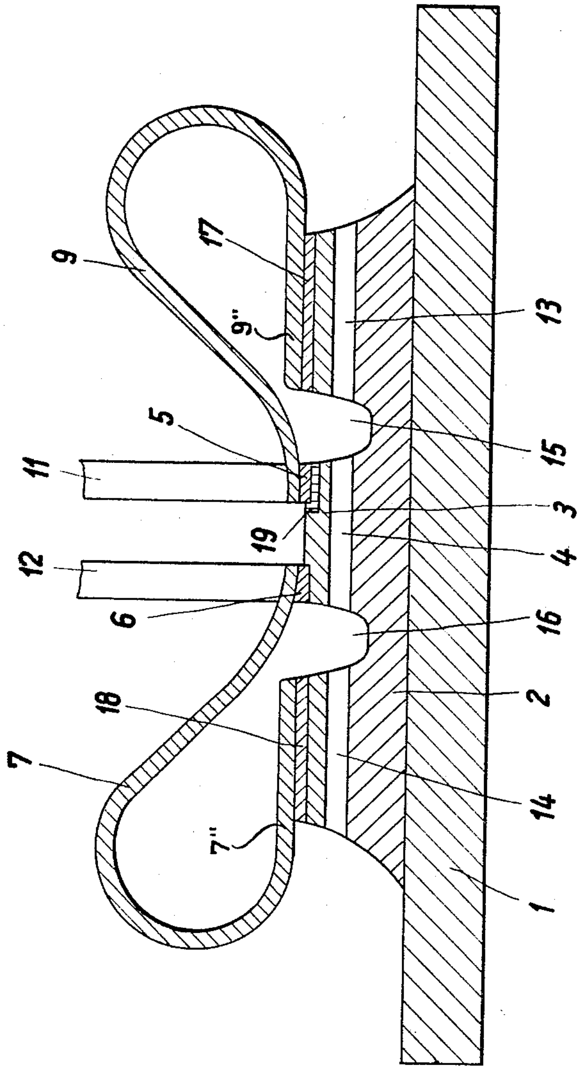
FIGURE 2 is a sectional view similar to FIGURE 1 but illustrating another embodiment of the present invention.

The arrangement of FIGURE 2 differs from that of FIGURE 1 essentially in that the semiconductor body of FIGURE 2 has a larger surface than the semiconductor body of FIGURE 1. The larger square dimension is provided because, in contrast to the arrangement according to FIGURE 1, the ends 7″ and 9″ of the metal strips 7 and 9, respectively, are not to be connected with the base plate 1 by the use of separating insulating layers 8 and 10; but, rather the coupling with the collector electrode is done capacitively in each case by a p-n junction present in the semiconductor body. The semiconductor body proper, in which the transistor effect is achieved, is separated from the p-n junctions 13 and 14 effecting the coupling by etched recesses 15 and 16. The p-n junctions are contacted by the strip-like lead wires 7 and 9 which are soldered onto the contact surfaces at 17 and 18. When coupling is provided by p-n junctions, insulating layers are not necessary .

Figure 3:
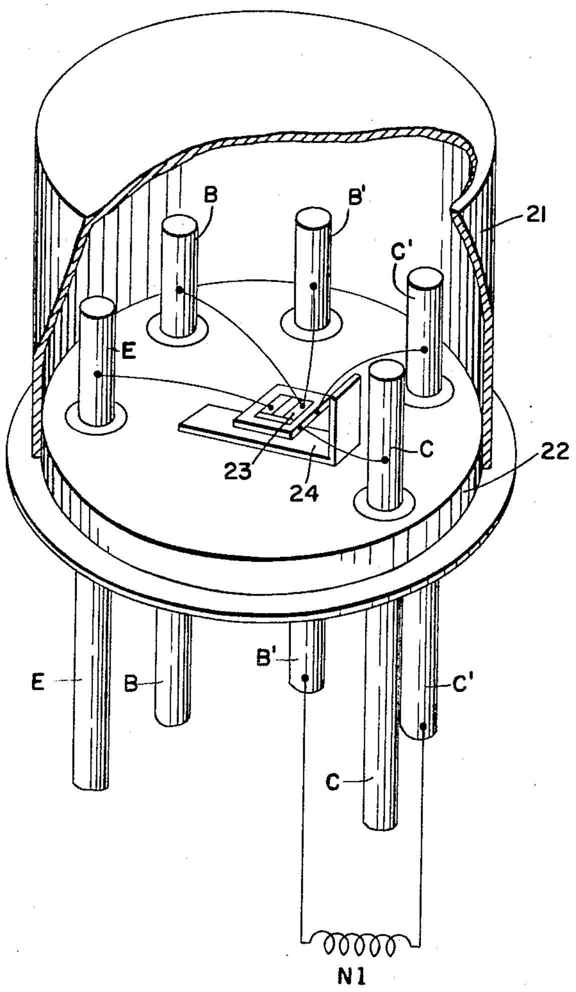
FIGURE 3 is a schematic perspective view of an embodiment having the neutralizing elements connected outside the housing.

FIGURE 3 is a drawing of an embodiment wherein there are external connections for the neutralizing element. A transistor illustrated having a housing and wherein the housing includes a housing cover 21 and a housing socket 22. The transistor 23 together with the collector base plate 24 is soldered to the housing socket. The emitter, base, and collector electrodes are attached by means of the socket terminals E, B, C, while separate socket pins B′ and C′ are provided for a neutralization inductance NI which is shown connected between the base and the collector.

It will be understood that the above description of the present invention is susceptible to various modifications, changes, and adaptations, and the same are intended to be comprehended within the meaning and range of equivalents of the appended claims.

What is claimed is:

1. In an arrangement comprising (a) a semiconductor device in a housing and having a plurality of electrodes;

(b) neutralizing or adjusting means for said semiconductor device for neutralizing the interelectrode capacitance, and (c) regular lead wires connected to said electrodes for connecting said semiconductor device to an external circuit, the improvement that:

said neutralizing means includes at least one separate electrode lead wire electrically connected at one end to at least one of said electrodes within the housing and having its other end electrically floating with respect to said device.

2. A semiconductor device comprising, in combination:

(a) a transistor having a housing and a plurality of electrodes;

(b) regular lead wires connected to said electrodes for connecting said device into a circuit; and (c) at least one neutralizing element including a separate electrode lead wire electrically connected to at least one electrode within the housing and having its other end electrically floating with respect to said transistor.

3. A semiconductor device as defined in claim 2, comprising an individual socket connection for each separate electrode lead wire.

4. A semiconductor device as defined in claim 2, wherein said semiconductor device has two zones of one type conductivity separated by a zone of the other type conductivity and said electrodes include a collector, a base, and an emitter electrode.

5. A semiconductor device as defined in claim 4, wherein a separate electrode lead wire is connected to said emitter electrode.

6. A semiconductor device as defined in claim 4, wherein a separate electrode lead wire is connected to said base electrode.

7. A semiconductor device as defined in claim 2 wherein, each neutralizing element is disposed within said housing.

8. A semiconductor device as defined in claim 7, wherein each neutralizing element has a variable inductance.

9. A semiconductor device comprising, in combination:

(a) a transistor having a housing and a plurality of electrodes;

(b) regular lead wires connected to said electrodes for connecting said device into a circuit; and (c) at least one neutralizing element including a separate electrode lead wire electrically connected to at least one electrode, said separate electrode lead wire extending out of said housing.

10. A semiconductor device comprising, in combination:

(a) a transistor having a housing and a plurality of electrodes;

(b) regular lead wires connected to said electrodes for connecting said device into a circuit;

(c) at least one neutralizing element including a separate electrode lead wire electrically connected to at least one electrode within the housing; and (d) a p-n junction polarized in a backward direction and interposed between an end of said neutralizing element and an electrode to prevent a DC type short circuit.

11. A semiconductor device comprising, in combination:

(a) a transistor having a housing and a plurality of electrodes;

(b) regular lead wires connected to said electrodes for connecting said device into a circuit; and (c) at least one neutralizing element including a separate electrode lead wire electrically connected to at least one electrode within the housing, said semiconductor device having two zones of one type conductivity separated by a zone of the other type conductivity and said electrodes including a collector, a base, and an emitter electrode, said separate electrode lead wires being connected to said emitter and said base electrodes.

12. A semiconductor device comprising, in combination:

(a) a transistor having a housing and a plurality of electrodes;

(b) regular lead wires connected to said electrodes for connecting said device into a circuit;

(c) at least one neutralizing element including a separate electrode lead wire electrically connected to at least one electrode within the housing, each neutralizing element being disposed within said housing; and (d) an insulating layer, said neutralizing element including a metal bow arranged between two corresponding electrodes, said insulating layer being provided at least between one end of the metal bow and one electrode.

13. A semiconductor device as defined in claim 12, wherein said insulating layer is so thin that the capacitance between the neutralizing element and the adjacent electrode is greater than the interelectrode capacitance to be neutralized.

14. A semiconductor device as defined in claim 12, wherein said metal bow is mechanically deformable.

15. A semiconductor device especially suited for high power and/or high frequency applications, comprising in combination:

(a) a transistor body having a collector electrode, a base electrode, and an emitter electrode;

(b) a plurality of regular lead wires connected to said electrodes for connecting said body into a circuit;

(c) a second plurality of lead wires connected to said electrodes; and (d) at least one neutralizing element means connected between two of said second plurality of lead wires for neutralizing interelectrode capacitance.

References Cited

UNITED STATES PATENTS

| | | | |
|---|---|---|---|
| 2,705,767 | 4/1955 | Hall | 317—235 |
| 2,784,300 | 3/1957 | Zuk | 317—235 |
| 2,840,710 | 6/1958 | Levy | 317—234 |
| 3,030,558 | 4/1962 | Berg et al. | 317—234 |

JOHN W. HUCKERT, *Primary Examiner.*

JAMES D. KALLAM, *Examiner.*

J. D. CRAIG, E. PUGH, *Assistant Examiners.*